United States Patent
Lee

(10) Patent No.: US 8,476,747 B2
(45) Date of Patent: Jul. 2, 2013

(54) LEADFRAME, LEADFRAME TYPE PACKAGE AND LEAD LANE

(75) Inventor: Sheng-Yuan Lee, Taipei Hsien (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 13/287,721

(22) Filed: Nov. 2, 2011

(65) Prior Publication Data
US 2012/0043651 A1   Feb. 23, 2012

Related U.S. Application Data

(63) Continuation of application No. 12/566,056, filed on Sep. 24, 2009, now Pat. No. 8,084,848.

(30) Foreign Application Priority Data

Jul. 1, 2009   (TW) .............................. 98122240 A

(51) Int. Cl.
    *H01L 23/495*   (2006.01)
(52) U.S. Cl.
    USPC .................................. 257/676; 257/E23.031
(58) Field of Classification Search
    USPC ................. 257/666, E23.031, 691–670, 672, 257/735, 736, 780, 781, 784; 361/813
    See application file for complete search history.

(56) References Cited

U.S. PATENT DOCUMENTS

| | | | |
|---|---|---|---|
| 8,294,249 B2 * | 10/2012 | Pilling et al. ................... | 257/676 |
| 2005/0186854 A1 | 8/2005 | Huang | |
| 2007/0011372 A1 | 1/2007 | Wang | |
| 2008/0005395 A1 | 1/2008 | Ong et al. | |
| 2010/0233908 A1 | 9/2010 | Tseng | |

FOREIGN PATENT DOCUMENTS

| | | |
|---|---|---|
| TW | 495672 | 7/2002 |
| TW | I296760 | 5/2008 |

OTHER PUBLICATIONS

Universal Serial Bus 3.0 Specification, Revision 1.0, Nov. 12, 2008, p. 1-p. 482.

* cited by examiner

*Primary Examiner* — Hoa B Trinh
(74) *Attorney, Agent, or Firm* — J.C. Patents

(57) ABSTRACT

A leadframe for a leadframe type package includes a chip base, and leads constituting lead lanes. One lead lane includes a pair of first differential signal leads, a pair of second differential signal leads, a pair of third differential signal leads between which and the pair of first differential signal leads is arranged the pair of second differential signal leads and a first power lead arranged between the pair of first and second differential signal leads. One of the pairs of differential signal leads has half-duplex transmission mode and two of the other pairs of differential signal leads have full-duplex transmission mode.

20 Claims, 4 Drawing Sheets

LEADFRAME, LEADFRAME TYPE PACKAGE AND LEAD LANE

CROSS-REFERENCE TO RELATED APPLICATION

This is a continuation application of and claims the priority benefit of U.S. application Ser. No. 12/566,056, filed on Sep. 24, 2009, now allowed, which claims the priority benefit of Taiwan application serial no. 98122240, filed on Jul. 1, 2009. The entirety of each of the above-mentioned patent applications is hereby incorporated by reference herein and made a part of this specification.

BACKGROUND OF THE INVENTION

1. Field of the Invention

The present invention generally relates to a chip packaging technology for semiconductor IC, and more particularly, to a leadframe type package technology.

2. Description of Related Art

In terms of leadframe type package, it is usual to utilize a multiple wire structure to establish leads with low inductance for a power net. A lower inductance is advantageous to reduce power bounce, and thereby to reduce noise coupling whatever passing through the above-mentioned power net or sourced from the power net.

FIG. 1 illustrates a conventional triple conductive wires structure used in a leadframe type package. Referring to FIG. 1, three conductive wires 20 respectively connected to each of three chip pads 10 are together connected to the same lead 30 so as to produce a parallel effect and thereby reduce the parasitic inductance. In some designs of the structures similar to the above-mentioned one for meeting the demand on a less inductance, more than three conductive wires, that is, four or more than four conductive wires 20, may be chosen in the designs.

For a conductive wire made of gold with a small section and a horizontal length of 1 mm, the roughly estimated inductance thereof is 1 nH. The inductance occurred on a power net would cause power bounce during switching signals. In particular, the faster switching the signals and the larger the inductance of the power net, the more serious the power bounce effect is. Since the above-mentioned conductive wires are in parallel connection and the parallel connection results in a lower parasitic inductance, so that the above-mentioned multiple wire structure is preferred.

However, the above-mentioned conductive wires must be connected to the same lead, which means the distances between the conductive wires are unable to be increased and, in turn, the mutual inductance between the lines would be relatively increased. The total inductance of a power net is composed of both self inductance and mutual inductance. As a result, the lower self inductance produced by the parallel connection and the increased mutual inductance would limit the total inductance of the multiple wire structure from being reduced to the design requirement.

SUMMARY OF THE INVENTION

Accordingly, an embodiment of the present invention provides a leadframe suitable for a leadframe type package. The leadframe includes a chip base and a plurality of leads. The leads comprise a plurality of lead lanes, wherein one of the lead lanes includes a pair of first differential signal leads, a pair of second differential signal leads, a pair of third differential signal leads and a first power lead. The pair of second differential signal leads is arranged between the pair of first differential signal leads and the pair of third differential signal leads. The first power lead is arranged between the pair of first differential signal leads and the pair of second differential signal leads. One of the pairs of differential signal leads has half-duplex transmission mode and two of the other pairs of differential signal leads have full-duplex transmission mode.

An embodiment of the present invention provides a leadframe type package, which includes a leadframe, a chip, a plurality of conductive wires connected between the leadframe and the chip and an encapsulant for encapsulating the chip and the conductive wires. The leadframe includes a chip base on which the chip is disposed and a plurality of leads. The leads comprise a plurality of lead lanes, wherein one of the lead lanes includes a pair of first differential signal leads, a pair of second differential signal leads, a pair of third differential signal leads and a first power lead. The pair of second differential signal leads is arranged between the pair of first differential signal leads and the pair of third differential signal leads. The first power lead is arranged between the pair of first differential signal leads and the pair of second differential signal leads. One of the pairs of differential signal leads has half-duplex transmission mode and two of the other pairs of differential signal leads have full-duplex transmission mode.

An embodiment of the present invention provides a lead lane suitable for a leadframe of a leadframe type package. The lead lane includes a pair of first differential signal leads, a pair of second differential signal leads, a pair of third differential signal leads and a first power lead. The pair of second differential signal leads is arranged between the pair of first differential signal leads and the pair of third differential signal leads. The first power lead is arranged between the pair of first differential signal leads and the pair of second differential signal leads. One of the pairs of differential signal leads has half-duplex transmission mode and two of the other pairs of differential signal leads have full-duplex transmission mode.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
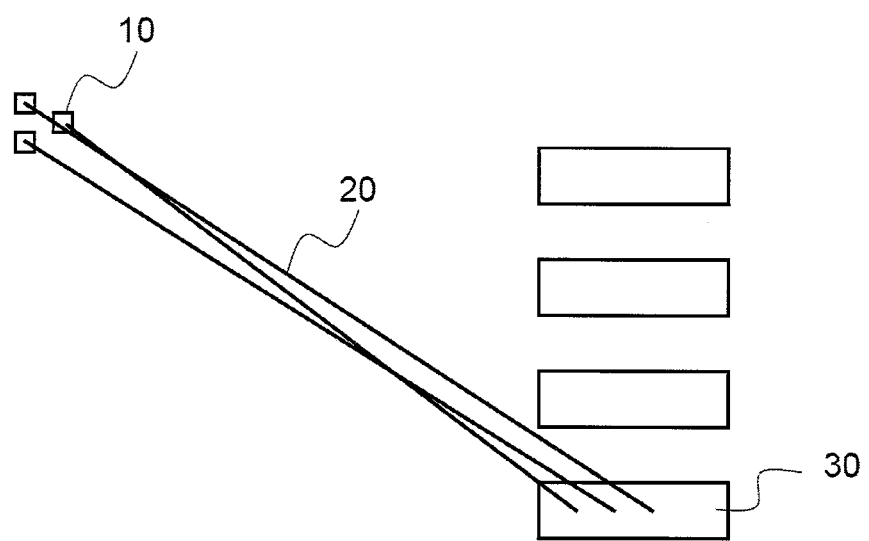
FIG. 1 illustrates a conventional triple conductive wires structure used in a leadframe type package.

Reference will now be made in detail to the present embodiments of the invention, examples of which are illustrated in the accompanying drawings. Wherever possible, the same reference numbers are used in the drawings and the description to refer to the same or like parts.

In order to solve the problem in the prior art where the mutual inductance between the conductive wires in a conventional multiple wire structure gets increased due to a limited distance between the conductive wires, in an embodiment of the present invention, an innovative design idea is provided that a plurality of conductive wires are respectively connected to a plurality of power leads so as to lower down the mutual inductances between the conductive wires.

Figure 2:
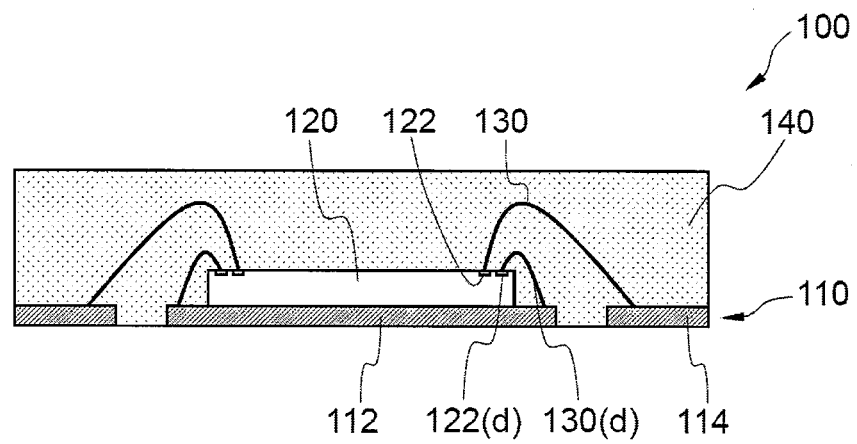
FIG. 2 illustrates a section of a leadframe type package according to an embodiment of the present invention.

FIG. 2 illustrates a section of a leadframe type package according to an embodiment of the present invention. Referring to FIG. 2, a leadframe type package 100 includes a leadframe 110, a chip 120, a plurality of conductive wires 130 and an encapsulant 140. The leadframe 110 includes a chip base 112 and a plurality of leads 114. The chip 120 is disposed on the chip base 112 and the conductive wires 130 are connected between the leadframe 110 and the chip 120. The encapsulant 140 encapsulates the chip 120 and the conductive wires 130. In the embodiment, a quad flat no-lead package (QFN) is exemplarily, but not limited to, taken as the leadframe type package to be discussed.

Figure 3:
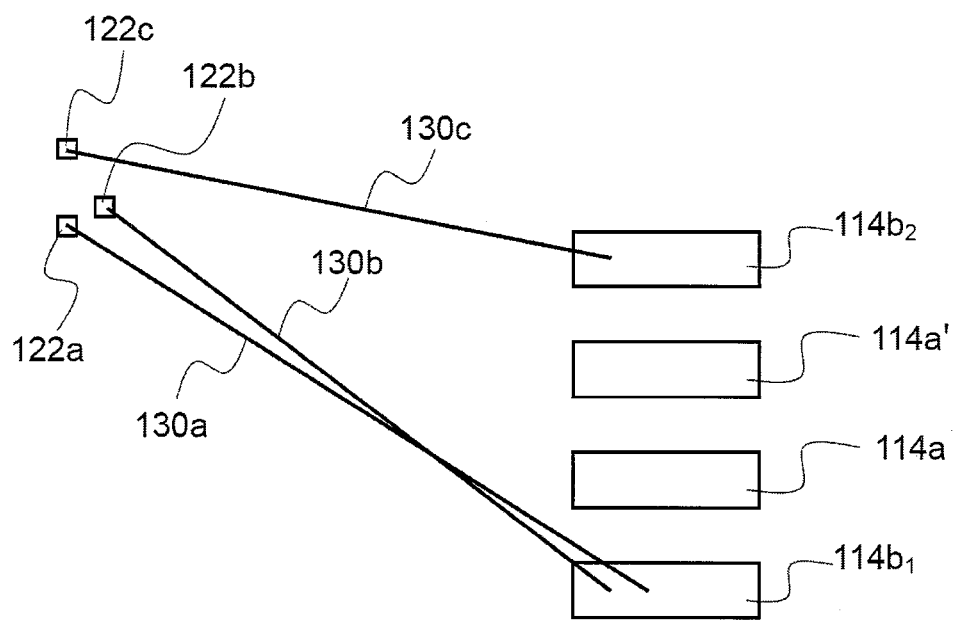
FIG. 3 illustrates the multiple wire structure of the leadframe type package in FIG. 2.

FIG. 3 illustrates the multiple wire structure of the leadframe type package in FIG. 2. Referring to FIGS. 2 and 3, in the embodiment, a pair of differential signal leads 114a and 114a' is disposed between two power leads 114$b_1$ and 114$b_2$. Besides, two ones among three conductive wires 130a, 130b and 130c (corresponding to three ones of the conductive wires 130 in FIG. 2), i.e., 130a and 130b, are respectively connected between the single power lead 114$b_1$ located at the lowest position in FIG. 3 and the chip pad 122a of the chip 120 in FIG. 2 (one of the chip pads 122 in FIG. 2) and connected between the single power lead 114$b_1$ located at the lowest position in FIG. 3 and the chip pad 122b of the chip 120 in FIG. 2 (one of the chip pads 122 in FIG. 2). In other words, both the two conductive wires 130a and 130b are connected to the single power lead 114$b_1$. The rest one 130c among the three conductive wires 130a, 130b and 130c is connected between the single power lead 114$b_2$ located at the highest position in FIG. 3 and a chip pad 122c (one of the chip pads 122 in FIG. 2).

Figure 4:
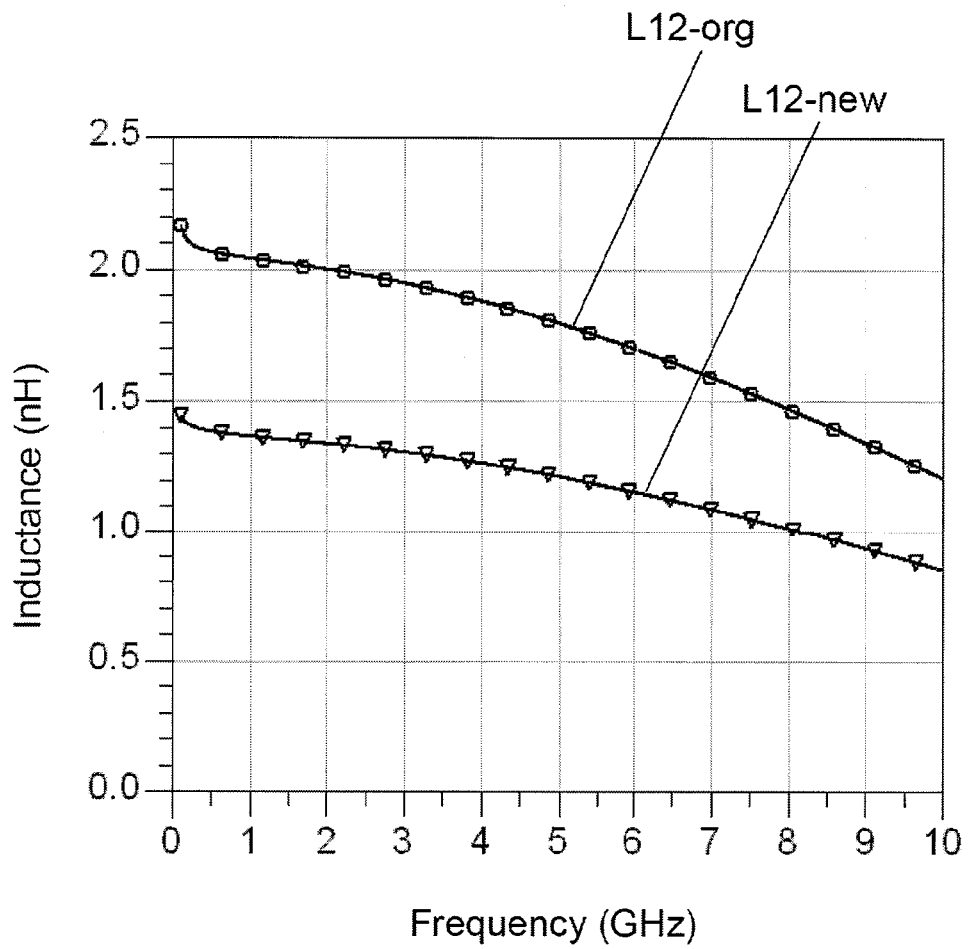
FIG. 4 is a graph of inductance vs. frequency of the multiple wire structure in FIGS. 1 and 3.

FIG. 4 is a graph of inductance vs. frequency of the multiple wire structure in FIGS. 1 and 3. Referring to FIG. 4, the total inductance L12-new produced by the three conductive wires 130a, 130b and 130c in FIG. 3 is less than the total inductance L12-org produced by the three conductive wires 20 in FIG. 1 in the related art. It can be seen that in the embodiment, the mutual inductance between the conductive wires 130a, 130b and 130c can be reduced through increasing the distances between the conductive wires 130a, 130b and 130c, and thereby, the total inductance between the conductive wires 130a, 130b and 130c is reduced.

Continuing to FIGS. 2 and 3, in order to make the leadframe 110 provide more power leads, in the embodiment, the chip base 112 serves as a grounding interface, and the conductive wire 130d (one of the conductive wires 130 in FIG. 2) is connected between the chip pad 122d of the chip 120 (one of the chip pads 122 in FIG. 2) and the chip pad 122. With the above-mentioned design, the chip base serving as a grounding interface can provide a grounding tunnel so as to reduce the number of the disposed grounded leads. In some embodiments not shown, even no need to dispose a grounded lead between the signal leads (for example, between the signal leads 114a and 114a'), between the power leads, or/and between the signal lead and the power lead.

Figure 5:
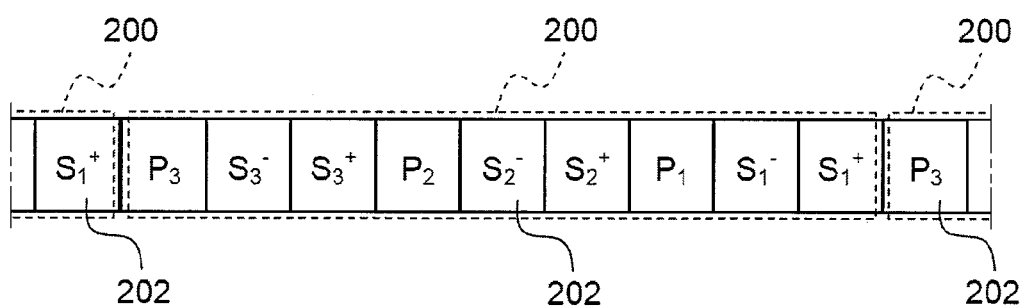
FIG. 5 illustrates a lead arrangement of a lead lane according to an embodiment of the present invention.

FIG. 5 illustrates a lead arrangement of a lead lane 200 according to an embodiment of the present invention. Referring to FIG. 5, a plurality of sequentially arranged lead lanes 200 is of a same leadframe (for example, the leadframe 110 in FIG. 2), and each lead lane 200 comprises a plurality of leads 202 (for example, the leads 114 in FIG. 2). Depending on different signal properties, a single lead lane 200 can include a pair of first differential signal leads $S_1^+$ and $S_1^-$, a pair of second differential signal leads $S_2^+$ and $S_2^-$, a pair of third differential signal leads $S_3^+$ and $S_3^-$, a first power lead $P_1$, a second power lead $P_2$ and a third power lead $P_3$.

Although the positions of each pair of differential signal leads $S^+$ and $S^-$ are marked in FIG. 5, but the marked positions do not limit the present invention. In fact, anyone skilled in the art can adjust the positions of each pair of differential signal leads $S^+$ and $S^-$ according to different requirements. For example, the original positions of each pair of differential signal leads $S^+$ and $S^-$ can be switched by each other as $S^-$ and $S^+$, or the positions of one of the pairs of differential signal leads $S^+$ and $S^-$ or the positions of two of the pairs of differential signal leads $S^+$ and $S^-$ can be switched by each other.

The pair of second differential signal leads $S_2^+$ and $S_2^-$ is arranged between the pair of first differential signal leads $S_1^+$ and $S_1^-$ and the pair of third differential signal leads $S_3^+$ and $S_3^-$. The first power lead $P_1$ is arranged between the pair of first differential signal leads $S_1^+$ and $S_1^-$ and the pair of second differential signal leads $S_2^+$ and $S_2^-$. The second power lead $P_2$ is arranged between the pair of second differential signal leads $S_2^+$ and $S_2^-$ and the pair of third differential signal leads $S_3^+$ and $S_3^-$. The pair of third differential signal leads $S_3^+$ and $S_3^-$ is arranged between the second power lead $P_2$ and the third power lead $P_3$.

In particular, the third power lead $P_3$ can be used to isolate the differential signal leads $S^+$ and $S^-$ of two adjacent lead lanes 200 from each other. In more details, the third power lead $P_3$ of the lead lane 200 can be used to isolate the pair of third differential signal leads $S_3^+$ and $S_3^-$ of the same lead lane 200 from the pair of first differential signal leads $S_1^+$ and $S_1^-$ of another lead lane 200 adjacent to the above-mentioned lead lane 200. In this way, the differential signal leads $S^+$ and $S^-$ respectively belonging to different lead lanes 200 are avoided from the negative influence of electric coupling due to a too close distance between two pairs of the differential signal leads $S^+$ and $S^-$ that are belong to two adjacent lead lanes 200 respectively.

In the embodiment, because of chip design requirement, the voltage provided by the first power lead $P_1$ can be less than the voltage provided by the second power lead $P_2$, and the voltage provided by the second power lead $P_2$ can be substantially equal to the voltage provided by the third power lead $P_3$.

In the embodiment, the first power lead $P_1$ provides a voltage to the pair of first differential signal leads $S_1^+$ and $S_1^-$, the pair of second differential signal leads $S_2^+$ and $S_2^-$ and the pair of third differential signal leads $S_3^+$ and $S_3^-$. The second power lead $P_2$ provides a voltage to the pair of first differential signal leads $S_1^+$ and $S_1^-$ and the pair of second differential signal leads $S_2^+$ and $S_2^-$. The third power lead $P_3$ provides a voltage to the pair of third differential signal leads $S_3^+$ and $S_3^-$.

In the embodiment, each lead lane 200 in FIG. 5 is suitable for transmitting signal of a USB 3.0 connector. Therefore, when the leadframe 110 in FIG. 2 has a plurality of lead lanes 200, it indicates the chip 120 packaged on the leadframe 110 is able to support a plurality of USB 3.0 connectors for transmitting signal.

In the embodiment, at least one among the first power lead $P_1$, the second power lead $P_2$ and the third power lead $P_3$ is simultaneously connected to a plurality of conductive wires, for example, the conductive wires 130a, 130b, 130c shown in FIG. 3.

Figure 6:
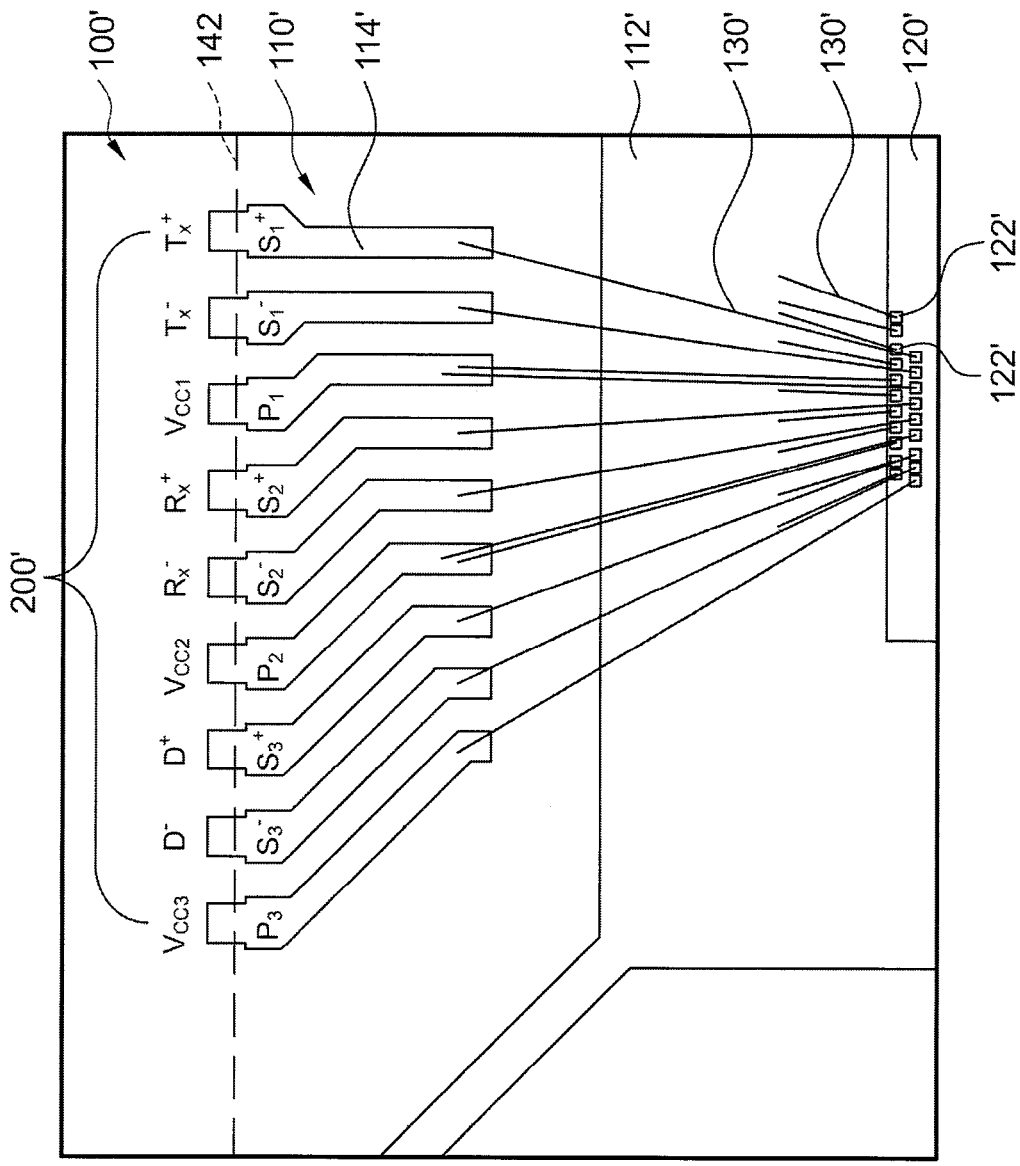
FIG. 6 is a top view of a portion of a leadframe type package according to another embodiment of the present invention.

FIG. 6 is a top view of a portion of a leadframe type package according to another embodiment of the present invention. Referring to FIG. 6, the design of the embodiment combines the leadframe type package of FIG. 2 with the lead lanes of FIG. 5, where the same or the similar marks of components are used. The leadframe type package 100' includes a leadframe 110', a chip 120', a plurality of conductive wires 130' respectively connected between the leadframe 110' and the chip 120' and an encapsulant encapsulating the chip 120' and the conductive wires 130' (only the border 142 of the encapsulant is shown in FIG. 6).

The leadframe 110' has a chip base 112' for disposing the chip 120' thereon and a plurality of leads 114'. In the embodiment, some of the conductive wires 130' are connected between the chip base 112' and a plurality of chip pads 122' of the chip 120', while some of the conductive wires 130' are respectively connected between the leads 114' and the chip pads 122' of the chip 120'.

A lead lane 200' comprised by a plurality of leads 114' includes a pair of first differential signal leads $S_1^+$ and $S_1^-$, a first power lead $P_1$, a pair of second differential signal leads $S_2^+$ and $S_2^-$, a second power lead $P_2$, a pair of third differential signal leads $S_3^+$ and $S_3^-$ and a third power lead $P_3$, all of which are sequentially arranged from right to left.

In the embodiment, the pair of first differential signal leads $S_1^+$ and $S_1^-$ can be a pair of transmitting differential signal leads $T_x^+$ and $T_x^-$ in architecture of universal serial bus 3.0 (architecture of USB 3.0), the pair of second differential signal leads $S_2^+$ and $S_2^-$ can be a pair of receiving differential signal leads $R_x^+$ and $R_x^-$ in architecture of USB 3.0, and the pair of third differential signal leads $S_3^+$ and $S_3^-$ can be a pair of transmitting/receiving differential signal leads $D^+$ and $D^-$ in architecture of USB 3.0 but supporting (i.e., compatible with) the architecture of USB 1.0 or architecture of USB 2.0. The first power lead $P_1$, the second power lead $P_2$ and the third power lead $P_3$ can be the power leads $V_{CC1}$, $V_{CC2}$, and $V_{CC3}$ in architecture of USB 3.0.

In architecture of USB 3.0, the transmitting differential signal leads $Tx^+$ and $Tx^-$ and the receiving differential signal leads $Rx^+$ and $Rx^-$ work in a full-duplex transmission mode, i.e., signal transmitting and receiving can be simultaneously conducted. The transmitting/receiving differential signal leads $D^+$ and $D^-$ work in a half-double-function transmission mode, i.e., only one of signal transmitting and receiving is allowed to be conducted, and under the mode, no way to receive data during transmitting data and no way to transmit data during receiving data.

In the embodiment of FIG. 5, to suit the architecture of USB 3.0, the first power lead $P_1$ provides a voltage of 1.0 V to the pair of first differential signal leads $S_1^+$ and $S_1^-$, the pair of second differential signal leads $S_2^+$ and $S_2^-$ and the pair of third differential signal leads $S_3^+$ and $S_3^-$; the second power lead $P_2$ provides a voltage of 3.3 V to the pair of first differential signal leads $S_1^+$ and $S_1^-$ and the pair of second differential signal leads $S_2^+$ and $S_2^-$; the third power lead $P_3$ provides a voltage of 3.3 V to the pair of third differential signal leads $S_3^+$ and $S_3^-$.

In summary, the present invention makes a plurality of conductive wires respectively connected to a plurality of power leads so as to reduce the mutual inductances between the conductive wires and thereby to reduce the power bounce and the noise coupling. Besides, the present invention further provides an arrangement of the leads of the lead lane under the above-mentioned architecture, and the arrangement can be used in a leadframe of a leadframe type package. Moreover, the lead lane provided by the present invention can be used in a leadframe for packaging a chip in architecture of USB 3.0.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A leadframe, suitable for a leadframe type package and comprising:
   a chip base; and
   a plurality of leads, constituting a plurality of lead lanes, wherein one of the lead lanes comprises:
   a pair of first differential signal leads;
   a pair of second differential signal leads;
   a pair of third differential signal leads, wherein the pair of second differential signal leads is arranged between the pair of first differential signal leads and the pair of third differential signal leads; and
   a first power lead, arranged between the pair of first differential signal leads and the pair of second differential signal leads,
   wherein one of the pairs of differential signal leads has a half-duplex transmission mode and two of the other pairs of differential signal leads have a full-duplex transmission mode.

2. The leadframe as claimed in claim 1, further comprising a second power lead arranged between the pair of second differential signal leads and the pair of third differential signal leads.

3. The leadframe as claimed in claim 2, wherein the second power lead provides a voltage to the pair of first differential signal leads, the pair of second differential signal leads and the pair of third differential signal leads.

4. The leadframe as claimed in claim 2, wherein a voltage provided by the first power lead is less than a voltage provided by the second power lead.

5. The leadframe as claimed in claim 1, wherein the pair of first differential signal leads is a pair of transmitting differential signal leads $T_x^+$ and $T_x^-$ in architecture of universal serial bus 3.0 (USB 3.0), the pair of second differential signal leads is a pair of receiving differential signal leads $R_x^+$ and $R_x^-$ in architecture of USB 3.0, and the pair of third differential signal leads is a pair of transmitting/receiving differential signal leads $D^+$ and $D^-$ in architecture of USB 3.0 support architecture of USB 1.0 or architecture of USB 2.0.

6. The leadframe as claimed in claim 1, wherein the first power lead provides a voltage to the pairs of the differential signal leads with the full-duplex transmission mode.

7. A leadframe type package, comprising:
   a leadframe;
   a chip;
   a plurality of conductive wires, connected between the leadframe and the chip; and
   an encapsulant, encapsulating the chip and the conductive wires,
   wherein the leadframe comprises:
   a chip base, on which the chip is disposed; and
   a plurality of leads, constituting a plurality of lead lanes, wherein one of the lead lanes comprises:
   a pair of first differential signal leads;
   a pair of second differential signal leads;
   a pair of third differential signal leads, wherein the pair of second differential signal leads is arranged between the pair of first differential signal leads and the pair of third differential signal leads; and
   a first power lead, arranged between the pair of first differential signal leads and the pair of second differential signal leads, wherein one of the pairs of differential signal leads has a half-duplex transmission mode and two of the other pairs of differential signal leads have a full-duplex transmission mode.

8. The leadframe type package as claimed in claim 7, further comprising a second power lead arranged between the pair of second differential signal leads and the pair of third differential signal leads.

9. The leadframe type package as claimed in claim 8, wherein the second power lead provides a voltage to the pair of first differential signal leads, the pair of second differential signal leads and the pair of third differential signal leads.

10. The leadframe type package as claimed in claim 8, wherein a voltage provided by the first power lead is less than a voltage provided by the second power lead.

11. The leadframe type package as claimed in claim 8, wherein one of the first power lead and the second power lead is simultaneously connected to a plurality of the conductive wires.

12. The leadframe type package as claimed in claim 7, wherein the chip base serves as a grounding interface, and one of the conductive wires is connected between the chip and the chip base.

13. The leadframe type package as claimed in claim 7, wherein the pair of first differential signal leads is a pair of transmitting differential signal leads $T_x^+$ and $T_x^-$ in architecture of USB 3.0, the pair of second differential signal leads is a pair of receiving differential signal leads $R_x^+$ and $R_x^-$ in architecture of USB 3.0, and the pair of third differential signal leads is a pair of transmitting/receiving differential signal leads $D^+$ and $D^-$ in architecture of USB 3.0 support architecture of USB 1.0 or architecture of USB 2.0.

14. The leadframe type package as claimed in claim 7, wherein the first power lead provides a voltage to the pairs of the differential signal leads with the full-duplex transmission mode.

15. A lead lane, suitable for a leadframe of a leadframe type package and comprising:
a pair of first differential signal leads;
a pair of second differential signal leads;
a pair of third differential signal leads, wherein the pair of second differential signal leads is arranged between the pair of first differential signal leads and the pair of third differential signal leads; and
a first power lead, arranged between the pair of first differential signal leads and the pair of second differential signal leads,
wherein one of the pairs of differential signal leads has a half-duplex transmission mode and two of the other pairs of differential signal leads have a full-duplex transmission mode.

16. The lead lane as claimed in claim 15, further comprising a second power lead arranged between the pair of second differential signal leads and the pair of third differential signal leads.

17. The lead lane as claimed in claim 16, wherein the second power lead provides a voltage to the pair of first differential signal leads, the pair of second differential signal leads and the pair of the third differential signal leads.

18. The lead lane as claimed in claim 16, wherein a voltage provided by the first power lead is less than a voltage provided by the second power lead.

19. The lead lane as claimed in claim 15, wherein the pair of first differential signal leads is a pair of transmitting differential signal leads $T_x^+$ and $T_x^-$ in architecture of USB 3.0, the pair of second differential signal leads are a pair of receiving differential signal leads $R_x^+$ and $R_x^-$ in architecture of USB 3.0, and the pair of third differential signal leads is a pair of transmitting/receiving differential signal leads $D^+$ and $D^-$ in architecture of USB 3.0 support architecture of USB 1.0 or architecture of USB 2.0.

20. The lead lane as claimed in claim 15, wherein the first power lead provides a voltage to the pairs of the differential signal leads with full-duplex transmission mode.

\* \* \* \* \*